United States Patent
Fimeri et al.

(10) Patent No.: US 11,652,285 B2
(45) Date of Patent: May 16, 2023

(54) COVER FOR AN ANTENNA AND METHOD OF PRODUCING SUCH A COVER

(71) Applicant: MOTHERSON INNOVATIONS COMPANY LIMITED, London (GB)

(72) Inventors: Garry Gordon Leslie Fimeri, Lonsdale (AU); Dean Caruso, Lonsdale (AU)

(73) Assignee: Motherson Innovations Company Limited, London (GB)

( * ) Notice: Subject to any disclaimer, the term of this patent is extended or adjusted under 35 U.S.C. 154(b) by 102 days.

(21) Appl. No.: 17/423,445

(22) PCT Filed: Jan. 16, 2020

(86) PCT No.: PCT/EP2020/051022
§ 371 (c)(1),
(2) Date: Jul. 15, 2021

(87) PCT Pub. No.: WO2020/148385
PCT Pub. Date: Jul. 23, 2020

(65) Prior Publication Data
US 2022/0069459 A1     Mar. 3, 2022

(30) Foreign Application Priority Data

Jan. 16, 2019  (DE) .................... 10 2019 101 033.0
Oct. 15, 2019  (AU) .............................. 2019903885

(51) Int. Cl.
*H01Q 1/42*  (2006.01)
*H01Q 1/02*  (2006.01)
*H01Q 1/32*  (2006.01)

(52) U.S. Cl.
CPC ............... *H01Q 1/422* (2013.01); *H01Q 1/02* (2013.01); *H01Q 1/3233* (2013.01)

(58) Field of Classification Search
CPC ............... H01Q 1/02; H01Q 1/32; H01Q 1/42
See application file for complete search history.

(56) References Cited

U.S. PATENT DOCUMENTS 6,195,055 B1 *   2/2001  Jones ...................... H01Q 1/02
                                                           343/912
6,344,828 B1 *   2/2002  Grantz .................... G01S 19/36
                                                           343/711

(Continued)

FOREIGN PATENT DOCUMENTS

DE   10 2015 004204 A1   8/2015
DE   10 2017 109138 A1   10/2018

(Continued)

OTHER PUBLICATIONS

International Search Report dated Apr. 22, 2020 of International application No. PCT/EP2020/051022 (4 pages).

(Continued)

*Primary Examiner* — Lam T Mai
(74) *Attorney, Agent, or Firm* — Jones Day

(57) ABSTRACT

A cover for at least one antenna emitting and/or sensing electromagnetic radiation in at least one first frequency band includes at least one first surface facing the antenna and at least one second surface averted to the antenna, and at least one first carrier layer into which hat least one heating element is embedded, the heating element being connected to a terminal at least partly extending from the first surface and/or being at least partly located on the first surface.

22 Claims, 1 Drawing Sheet

(56) References Cited

U.S. PATENT DOCUMENTS

| | | | | |
|---|---|---|---|---|
| 2011/0298675 A1* | 12/2011 | Cummings | ............... | H01Q 1/02 |
| | | | | 343/704 |
| 2012/0080527 A1* | 4/2012 | Finn | ..................... | H01P 11/001 |
| | | | | 235/492 |
| 2015/0135827 A1 | 5/2015 | Benz et al. | | |
| 2017/0352938 A1 | 5/2017 | Okumura et al. | | |

FOREIGN PATENT DOCUMENTS

| | | |
|---|---|---|
| GB | 1 352 558 A | 5/2015 |
| JP | 2017215242 | 12/2017 |

OTHER PUBLICATIONS

Written Opinion dated Apr. 22, 2020 of International application No. PCT/EP2020/051022 (7 pages).
Office Action dated Jan. 8, 2020 of German Application No. DE 10 2019 101 033.0 (in German only) (6 pages).

* cited by examiner

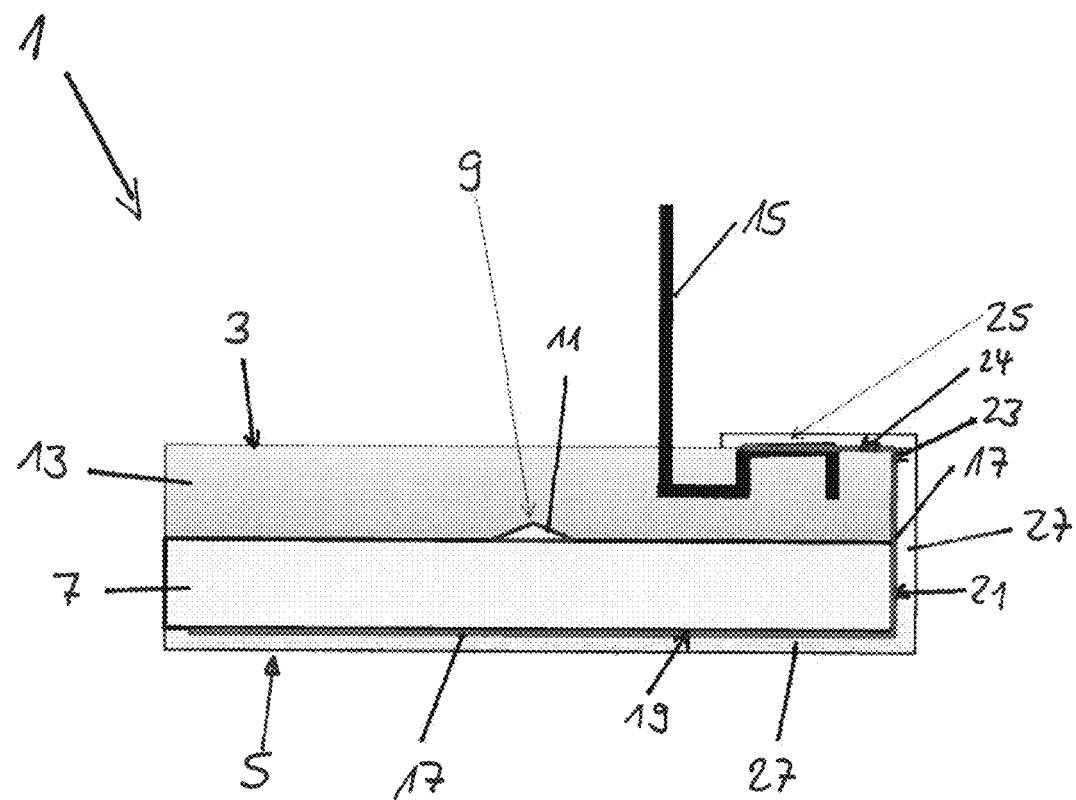

COVER FOR AN ANTENNA AND METHOD OF PRODUCING SUCH A COVER

CROSS-REFERENCE TO RELATED APPLICATIONS

This application is a National Stage Entry of International Patent Application No. PCT/EP2020/051022, filed Jan. 16, 2020, which claims the benefit of priority to German Patent Application No. DE 10 2019 101 033, filed Jan. 16, 2019, and the benefit of Australian Patent Application No. AU 2019903885, filed Oct. 15, 2019, each of which is hereby incorporated by reference herein in its entirety for all purposes.

BACKGROUND

1. Field of the Invention

The invention is directed to a cover for at least one antenna emitting and/or sensing electromagnetic radiation in at least one first frequency band, the cover comprising at least one first surface facing the antenna and at least one second surface averted to the antenna.

2. Related Art

Such covers, which are referred to as radomes in case the antenna is used to emit or receive radar waves, are generally known from the state of the art. Such radomes are more and more used in the automotive industry. Especially the automotive industry is experiencing an increase in technology preparation of such radar systems which dynamically impact the automotive radar market in the future. There is a significant growth in electromagnetic wave emitting and receiving devices in vehicles driven by increased safety and vehicle autonomy requirements.

Of particular interest are radar systems using frequencies of 24 GHz and 77 GHz that are located at the front of a vehicle used for control of various systems such as autonomous cruise control. Often such systems are located behind components of a vehicle such as car emblems which act as radomes. To ensure the function of the safety critical radar system in poor weather conditions, a heater can be added. The heater will keep the surface of the device free of snow and frost to ensure radar functionality.

For example DE 10 2011 107 216 A1 discloses a radome for a sending and receiving unit of radar waves of a vehicle. The radome disclosed in this document comprises a heating unit that is located between a carrier structure and a covered layer.

When using such heating devices, it is important to ensure that an attenuation and signal loss is avoided. Also a negative impact on the outer appearance of the device should be avoided.

Generally metallic items sitting in front of an antenna increase such problems of attenuation. In the state of the art it was proposed to use heat elements that are as thin as possible, for example conductive printing thin tracks within a film.

However, such methods and devices are complicate to produce, especially to ensure a precise location of the film with regard to the antenna to avoid negative impact on the sending and receiving capabilities.

Furthermore the heat elements have to be made as thin as possible to avoid an attenuation or signal loss. However, the reduction of thickness is limited as the heat devices have to be on the other hand thick enough to provide sufficient rigidity and resistance to "survive" the production process. Thus attenuation and signal losses cannot be fully eliminated. In addition the production method wherein a heated radome construction comprises the provision of an independent heater pad with conductive elements and overmolding the heater pad carrier layer during or after its construction is expensive and also creates issues for connecting the heater element with an energy source.

SUMMARY

It is thus the objective of the present invention to provide a heated cover element, especially in form of a radome used in a vehicle, to overcome the disadvantages known from the state of the art, especially to provide a cover and method to produce such a cover that allows a less complicate and thus less expensive production of the cover and simultaneously provides less attenuation and loss for the emitted and received radiation.

The objective is achieved with regard to the cover by a cover for at least one antenna emitting and/or sensing electromagnetic radiation in at least one first frequency band, the cover comprising at least one first surface facing the antenna and at least one second surface averted to the antenna, the cover further comprising at least one first carrier layer into which at least one heating element is embedded, the heating element being connected to a terminal at least partly extending from the cover and/or being at least partly located in the cover, wherein the heating element comprises at least one wire, wherein further the wire is embedded at least partly in the first carrier layer on a first side of the first carrier layer facing the second surface and is extending from the first side to the terminal along a second side of the first carrier layer into the direction of the first surface, wherein the wire is further at least partly embedded in at least one second carrier layer, on a first side of the second carrier layer facing away from the first carrier layer and/or on a second side of the second carrier layer connecting the first side of the second carrier layer with the second side of the first carrier layer, the second carrier being located on a third side of the first carrier layer facing the first surface.

It is preferred that the first carrier layer is self-supporting, especially at least partly forms a supporting structure of the cover, the first carrier layer is transparent for electromagnetic radiation in the first frequency band and/or at least one second frequency band or is transparent for electromagnetic radiation in the first frequency band and at least partly opaque for electromagnetic radiations in the second frequency band, and/or the terminal is at least partly extending from the first surface and/or being at least partly located on the first surface.

In the before described embodiments it is preferred that on the first carrier layer, especially on the third side of the first carrier layer, at least partly a first coating is located, wherein preferably the first coating is highly reflective for electromagnetic radiation in the second frequency band and/or transparent for electromagnetic radiation in the first frequency band, especially the first coating forms at least partly at least one frequency selective surface band pass filter.

The before mentioned embodiment may be characterized in that the first coating has the form of and/or presents at least one logo, trademark, character, number, a decorative pattern and/or decorative design and/or the surface of first carrier layer in the area of the first coating is at least partly structured.

It is also proposed that the second carrier layer is self-supporting, wherein especially the second carrier layer at least partly forms the supporting structure of the cover, the second carrier layer is preferably at least partly opaque for electromagnetic radiation in the second frequency band and/or at least partly transparent for electromagnetic radiation in the first frequency band and/or the second frequency band, the terminal is at least partly located within the second carrier layer and/or the first coating is at least partly located between the first carrier layer and the second carrier layer.

The before mentioned embodiment may be characterized in that the first side of the second carrier layer is facing away from the first coating.

An inventive cover may be characterized by at least one protective coating covering at least partly the first side of the first carrier layer, the second side of the first carrier layer, the second side of the second carrier layer and/or the first side of the second carrier layer and/or the wire.

For this embodiment it is especially preferred that the protective coating is at least partly transparent for electromagnetic radiation in the second frequency band and/or the first frequency band.

The invention also proposes that the antenna is a radar antenna and/or the first frequency band is radar frequency, especially 10 GHz to 130 GHz, preferably 20 GHz to 100 GHz, more preferred 20 GHz to 30 GHz, 70 GHz to 80 GHz and/or 90 GHz to 100 GHz, most preferably 24 GHz, 77 GHz or 93 GHz.

It is preferred that the second frequency band comprises 384 THz to 789 THz and/or visual light.

For the cover it is also proposed that the wire is embedded in the first carrier layer, especially the first side of the first carrier layer, in a pattern, the wire forms at least partly at least one frequency selective surface band pass filter, and/or the wire has at least partly a diameter of less than 60 microns, preferably less than 40 microns, more preferred less than 30 microns.

For the before described embodiment it is preferred that the pattern is transparent for electromagnetic radiation in the first frequency band, especially electromagnetic radiation having a predefined polarization.

Finally the inventive cover may be characterized by at least one second terminal being connected to the wire.

The object with regard to the method is solved by a method of producing a cover for at least one antenna emitting and/or sensing electromagnetic radiation in at least one first frequency band, especially a cover according to one of the preceding claims, the cover having at least one first surface facing the antenna and at least one second surface averted to the antenna, comprising the steps of providing a first carrier layer; and at least partly embedding at least one heating element in the first carrier layer, wherein the embedding of the heating element comprises embedding at least one wire of the heating element at least partly in the first carrier layer on a first side of the first carrier layer facing the second surface and embedding the wire at least partly on a second side of the first carrier layer, the second side extending from the first side of the first carrier layer into the direction of the first surface.

It is especially preferred that providing the first carrier layer comprises molding, especially injection molding, of at least one first material, especially comprising a thermoplastic material, Polycarbonate, polymethylmethacrylate, polyethylene, polyester, polyvinyl chloride, polypropylene, polystyrene, acrylonitrile butadiene styrene, polyacrylate and/or a mixture thereof.

The method can be furthermore characterized in that the embedding of the wire comprises at least partly melting of the first carrier layer, preferably ultrasonically, thermally, thermosonically and/or mechanically, especially using compression.

It is also preferred that the method comprises connecting the wire to at least one terminal at least partly extending from the first surface and/or being at least partly located on the first surface, especially using spot welding, soldering and/or brazing.

The invention furthermore proposed for the method that at least one, especially for electromagnetic radiation in a second frequency band highly reflective, first coating is provided on at least one, preferably structured area of the first carrier layer, especially on at least one third side of the first carrier layer facing the first surface or the second surface.

Furthermore it is proposed that the method further comprises, especially before embedding the wire in the first carrier layer and/or after providing the first coating, providing at least one second carrier layer on the third side of the first carrier layer, wherein preferably the terminal is at least partly located in the second carrier layer.

The before described method can be characterized in that providing the second carrier layer comprises molding, especially injection molding, of a second material, especially comprising the first material, a thermoplastic material, Polycarbonate, Acrylonitrile butadiene styrene (ABS), Acrylnitril-Ethylen-Styrol (AES) and/or Polycarbonate acrylonitrile butadiene styrene (PCABS) and/or polyacrylate, polyester, polystyrene, polyethylene, polypropylene, polyamides, polyimides, polycarbonate, epoxy, phenolic, acrylonitrile-butadiene-styrenes, acetyl materials, poly (2,2'-dihydroxyphenylpropane) carbonate, polydiethyleneglycol bis(allyl carbonate), polymethylmethacrylate, polystyrene polycarbonate, and/or blends thereof, wherein especially the terminal is held in place, preferably by solidified plastic, during the molding.

Further advantageous embodiments may be characterized in that the method further comprises, preferably after the embedding of the wire, providing at least one protective coating, especially at least partly covering the first carrier layer, the wire, the second carrier layer and/or the terminal.

Finally it is proposed that the embedding is carried out using a stationary wire embedding system, wherein especially the first carrier layer, the second carrier layer and/or the terminal is/are moved relative to at least one wire embedding head of the wire embedding system.

The invention is thus based on the surprising finding that by including the heating element into the cover by embedding a heating wire directly in a, especially self-supporting, carrier layer, especially the first and/or second carrier layer, after the respective carrier layer has been produced, it becomes possible to produce the cover in a less complicate procedure being less expensive and less fault prone. Simultaneously, it is possible to locate a heating element more precisely relative to the antenna such that any attenuation or losses are avoided, at least significantly reduced. In comparison to heating pads known in the state of the art that do not provide rigidity to the cover, the carrier layer of the inventive cover preferably provides the supporting structure of the cover, especially due to its self-supporting characteristics. Furthermore it becomes possible to lead the wire around the carrier layer, especially the first and/or second carrier layer, such that a terminal to connect the heating element with an energy source can be located on a side of the cover not visible from the side being opposite of the antenna.

Especially the terminal can be located on the side facing the antenna such that it is outside the radiation area of the antenna not influencing the emitting and receiving of radiation. In addition it allows to form the heating element as a frequency selective surface band pass filter and/or having a wire that has such a small diameter that it does not negatively influence the transmission of radiation and the heating element.

It is especially preferred that the terminal is also embedded in the cover, especially the first and/or second carrier layer. It is especially preferred that the terminal is located within a mold when the first or second carrier layer is/are produced by a molding process.

The use of two carrier layers allows that the cover can be used as an emblem in front of the antenna. To reach this aim, it is preferred that the first carrier layer is transparent for electromagnetic radiation in the visual range as well as electromagnetic radiation emitted by the antenna. It allows to deposit a first coating at least partly onto the carrier layer from the first carrier layer that is highly reflective for electromagnetic radiation in the visual range. To increase the outer appearance of the cover, it might be worthwhile that the first and/or second carrier layer is structured in the area of the first coating to provide a 3D logo.

Thus a person looking onto the cover will only see the area of the first coating. In this regard it is preferred that the coating provides a frequency selective surface band pass filter allowing the transmission of radiation sent and received by the antenna.

To increase the outer appearance it might be further advantageous in case the second carrier layer is transparent for the radiation of the antenna but is opaque for the visual light. In this way a user viewing from the side of the first carrier layer does not see the antenna but only sees the logo presented by the first coating. It is preferred that the wire is embedded in the first coating on the side facing away from the antenna, is then led around the first carrier layer by embedding it in a second side of the first carrier, then embedding it in a second side of the second carrier and finally leading the wire to a terminal located on the carrier layer being directed to the antenna.

To avoid any damage of the wire during the use of the cover it might be preferred to locate a protective coating at least in the area of the carrier layer in which the wire is located or embedded.

The protective coating is preferably transparent for the electromagnetic radiation in the visual range as well as for the electromagnetic radiation of the antenna.

With the invention it becomes possible to embed a wire in the carrier layers such that the wire forms a pattern and/or a frequency selective surface bend pass filter. Especially the pattern and/or the filter are formed such that the electromagnetic radiation sent and received by the antenna is not attenuated, at least for a predefined polarization of the radiation.

Preferably the carrier layers are produced in an injection molding process using a thermoplastic material providing a high resistance against outer influences and furthermore providing the wanted transparencies and viewing characteristics.

It is proposed that a wire it at least partly embedded into the carrier layers by ultrasonic melting. This technique especially allows that the embedding is carried out by a stationary embedding wire system in which the carrier layer is moved in a 3D-direction to locate the carrier layer relative to the wire head to locate the wire at the predefined location and in the desired position. This method is preferred as it allows to locate the wire on the front, side and back surfaces of the carrier layers without the need for a wire embedding head to be moved in three-dimensions.

The heater wire element is preferably connected to the terminal that is already located in the carrier layer when the carrier layer is produced by laying the wire over the terminals which are preassembled and allow an easy connection via a joining process such as welding, soldering or brazing. Again the location of the terminal on the side of the cover that is directed to the antenna, leads to the advantage that such a welding does not negatively influence the sending and receiving characteristics of the antenna.

Further advantages of the invention become apparent form the following description of a preferred embodiment of the invention which is explained with the help of the enclosed FIGURE.

BRIEF DESCRIPTION OF THE DRAWINGS

FIG. 1 shows a schematic cross-sectional view of a cover according to the invention.

DETAILED DESCRIPTION

The cover 1 comprises a first surface 3 facing an antenna not shown in FIG. 1. A second surface 5 is located on the side averted to the antenna. The cover 1 furthermore comprises a first carrier layer 7 that is structured at least in the area 9.

The carrier layer 7 is made of a material that is transparent for the radiation emitted and received by the antenna as well as radiation in the visual range. In the structured area 9, however, a first coating is located. The coating 11 is highly reflective for electromagnetic radiation at least in the visual range so it can be seen by a user looking at the second surface 5 of the cover 1. This allows to produce a logo within the cover 1.

A second carrier layer 13 is located on the side of the first carrier layer 7 facing the first surface 3. In contrast to the first carrier layer, the second carrier layer is opaque for electromagnetic radiation in the visual range. In this way the user looking at the cover 1 form the side of the surface 5, can see the coating 11 but cannot see the antenna located behind the carrier layer 13.

At least partly embedded in the second carrier layer 13 is a terminal 15. Terminal 15 allows to connect a heating element cover 1 with an energy source. Of course a second terminal is provided to provide a closed electrical circuit for the heating element. The further terminal is not shown in the FIGURE. The heating device comprises a wire 17. The wire 17 is embedded in the first carrier layer on the first side 19 facing into the direction of the surface 5. Furthermore the wire 17 is led on the side surface 21 (the second side of the first carrier layer) into the direction of the second carrier layer 13 and the terminal 15, respectively. For this purpose the wire 17 is led along a side surface 23 of the second carrier layer onto a side 24 of a second carrier layer 13 where terminal 15 is located. The wire 17 is connected to the terminal 15 in an area 25 by welding or soldering. To protect the cover 1 from outer environmental influences, a second coating 27 covers at least partly the first carrier 7 layer and the second carrier layer 13, especially in the areas where the wire 17 is embedded.

The construction of cover 1 allows an easy and less expensive production of the cover 1, especially allows a precise location of the heating element relative to the antenna and allows to use very thin wires that do not negatively influence the sending and/or receiving characteristics of the antenna.

In the following the production of the cover 1 according to the inventive method as explained.

In a first step the first carrier layer 7 is formed. This is especially carried out by an injection molding process of a first material, especially a thermoplastic material like polycarbonate. The mold is especially formed to produce the structured area 9.

In the next step the area 9 and/or other parts of the first carrier layer 7 are at least partly covered with the coating 11 to provide the outer impression of the emblem. In the next step, the part formed by the carrier layer 7 and the coating 11 is overmolded by a second material, for example an opaque AES/ABS material. During this molding step, the terminal 15 is placed in a predefined position, for example held in place by a solidified plastic material. Alternatively the terminal 15 may be molded through a connector. In both methods, a part of the terminal 15 is left exposed, that means it is not overmolded to provide a connection area for the wire 17.

According to the invention, after the production of the main structure of the cover 1, especially the first carrier layer and/or the second carrier layer 13, the heating element is formed. This is reached by embedding the wire 17, forming a wire track, especially a copper wire track, into the respective surfaces of the first carrier layer 7 and the second carrier layer 13. The embedding process, especially done by an ultrasonic welding, allows the use of very thin wires, for example having a diameter of 40 μm. Such wire diameters significantly reduce the attenuation of radiation of the antenna. Furthermore it becomes possible to embed the wire in a form of a pattern to provide a frequency selective surface band pass filter. This technology furthermore allows to use a stationary embedding wire system in which the preformed cover especially comprising the first and second carrier layer, are moved relative to a wire embedding head providing wire through a reel. The wire is especially embedded in the respective part of the cover 1 such that the wire is run over the area 25 of the terminal 15. This allows to form a joint between the wire and terminal 15 by a spot welding, soldering or brazing.

To increase the durability of the cover, especially the heating element, it is preferred that after the wire is embedded, a second, protective coating is produced, preferably by injection molding, locating a transparent thermoplastic material, especially polycarbonate, at least in the areas of the wire track. This provides protection for the wire and the protective coating hides any protrusions/defects from the embedding process.

In alternative embodiments the structure of the cover, especially the order of the respective layers, coatings and the position of the wire and the terminal might be changed, including especially using an alternative method of production compared to the method described in the before paragraphs. Especially the first carrier layer might be located on the side of the cover facing the antenna and the second carrier layer might be located on the side of the cover being averted to the antenna. For the production of the cover in this case the first carrier layer is provided, the heating wire is embedded in the first carrier layer on the side of the first carrier layer facing away from the antenna before the first coating is applied to this side of the first carrier layer. In the next step the second carrier layer is located on the side of the first carrier layer facing away from the antenna. Also in this embodiment a protective coating might be applied.

To avoid a visibility of the antenna for a user the first carrier layer might be at least partly opaque for visual light whereas the second carrier layer might be transparent for visual light to allow a visibility of the (reflective) first coating.

In this embodiment the wire would extend around the first carrier layer to a terminal being located on the side of the first carrier layer facing the antenna.

Thus in summary, when seen from the side of the antenna, in this embodiment the cover might comprise the terminal, the first carrier layer, the embedded heating wire, the first coating, the second carrier layer and the protective coating.

The features disclosed in the description, the claims and the FIGURE can be essential for the claimed subject-matter in its respective embodiments both, when taken alone or in combination with other features.

REFERENCE SIGNS 1 cover
3 surface
5 surface
7 carrier layer
9 structured area
11 coating
13 carrier layer
15 terminal
17 wire
19 side
21 side
23 side
24 side
25 area
27 coating

What is claimed is:

1. A cover for at least one antenna emitting and/or sensing electromagnetic radiation in at least one first frequency band, the cover comprising:
    at least one first surface facing the antenna;
    at least one second surface averted to the antenna;
    at least one first carrier layer into which at least one heating element is embedded, the heating element being connected to a terminal at least partly extending from and/or being at least partly located in the cover,
    wherein the heating element comprises at least one wire,
    the wire is embedded at least partly in the first carrier layer on a first side of the first carrier layer facing the second surface and is extending from the first side to the terminal along a second side of the first carrier layer into a direction of the first surface, and
    the wire is further at least partly embedded in at least one second carrier layer, on a first side of the second carrier layer facing away from the first carrier layer and/or on a second side of the second carrier layer connecting the first side of the second carrier layer with the second side of the first carrier layer, the second carrier being located on a third side of the first carrier layer facing the first surface.

2. The cover according to claim 1, wherein the first carrier layer is self-supporting, especially at least partly forms a supporting structure of the cover, the first carrier layer is transparent for electromagnetic radiation in the first frequency band and/or at least one second frequency band or is transparent for electromagnetic radiation in the first frequency band and at least partly opaque for electromagnetic radiations in the second frequency band, and/or the terminal is at least partly extending from the first surface and/or being at least partly located on the first surface.

3. The cover according to claim 1, wherein, on the first carrier layer or on the third side of the first carrier layer, at least partly a first coating is located, and
the first coating is highly reflective for electromagnetic radiation in the second frequency band and/or transparent for electromagnetic radiation in the first frequency band, especially the first coating forms at least partly at least one frequency selective surface band pass filter.

4. The cover according to claim 3, wherein the first coating has the form of and/or presents at least one logo, trademark, character, number, a decorative pattern and/or decorative design and/or the surface of first carrier layer in the area of the first coating is at least partly structured.

5. The cover according to claim 1, wherein the second carrier layer is self-supporting, the second carrier layer at least partly forms the supporting structure of the cover, the second carrier layer is at least partly opaque for electromagnetic radiation in the second frequency band and/or at least partly transparent for electromagnetic radiation in the first frequency and/or the second frequency band, the terminal is at least partly located within the second carrier layer, and/or the first coating is at least partly located between the first carrier layer and the second carrier layer.

6. The cover according to claim 3, wherein the first side of the second carrier layer is facing away from the first coating.

7. The cover according to claim 1, further comprising at least one protective coating covering at least partly the first side of the first carrier layer, the second side of the first carrier layer, the second side of the second carrier layer and/or the first side of the second carrier layer and/or the wire.

8. The cover according to claim 7, wherein the protective coating is at least partly transparent for electromagnetic radiation in the second frequency band and/or the first frequency band.

9. The cover according to claim 1, wherein the antenna is a radar antenna and/or the first frequency band is radar frequency of 10 GHz to 130 GHz, 20 GHz to 100 GHz, 20 GHz to 30 GHz, 70 GHz to 80 GHz, 90 GHz to 100 GHz, 24 GHz, 77 GHz, or 93 GHz.

10. The cover according to claim 1, wherein the second frequency band comprises 384 THz to 789 THz and/or visual light.

11. The cover according to claim 1, wherein the wire is embedded in the first carrier layer or the first side of the first carrier layer, in a pattern, the wire forming at least partly at least one frequency selective surface band pass filter, and/or the wire having at least partly a diameter of less than 60 microns, less than 40 microns, or less than 30 microns.

12. The cover according to claim 11, wherein the pattern is transparent for electromagnetic radiation in the first frequency band, the electromagnetic radiation having a predefined polarization.

13. The cover according to claim 1, wherein at least one second terminal is connected to the wire.

14. A method of producing the cover according to claim 1, comprising:
providing the first carrier layer; and
at least partly embedding the at least one heating element in the first carrier layer,
wherein the embedding of the heating element comprises embedding at least one wire of the heating element at least partly in the first carrier layer on a first side of the first carrier layer facing the second surface and embedding the wire at least partly on a second side of the first carrier layer, the second side extending from the first side of the first carrier layer into the direction of the first surface.

15. The method according to claim 14, wherein providing the first carrier layer comprises molding or injection molding of at least one first material comprising a thermoplastic material, polycarbonate, polymethylmethacrylate, polyethylene, polyester, polyvinyl chloride, polypropylene, polystyrene, acrylonitrile butadiene styrene, polyacrylate and/or a mixture thereof.

16. The method according to claim 14, wherein the embedding of the wire comprises at least partly melting of the first carrier layer ultrasonically, thermally, thermosonically and/or mechanically using compression.

17. The method according to claim 14, further comprising connecting the wire to at least one terminal at least partly extending from the first surface and/or being at least partly located on the first surface using spot welding, soldering and/or brazing.

18. The method according to claim 14, wherein at least one, especially for electromagnetic radiation in a second frequency band highly reflective, first coating is provided on at least one structured area of the first carrier layer, on at least one third side of the first carrier layer facing the first surface or the second surface.

19. The method according to claim 14, further comprising, before embedding the wire in the first carrier layer and/or after providing the first coating, providing at least one second carrier layer on the third side of the first carrier layer, wherein the terminal is at least partly located in the second carrier layer.

20. The method according to claim 14, wherein
providing the second carrier layer comprises molding or injection molding of a second material comprising the first material, a thermoplastic material, Polycarbonate, Acrylonitrile butadiene styrene (ABS), Acrylnitril-Ethylen-Styrol (AES) and/or Polycarbonate acrylonitrile butadiene styrene (PCABS) and/or polyacrylate, polyester, polystyrene, polyethylene, polypropylene, polyamides, polyimides, polycarbonate, epoxy, phenolic, acrylonitrile-butadiene-styrenes, acetyl materials, poly (2,2'-dihydroxyphenylpropane) carbonate, polydiethyleneglycol bis(allyl carbonate), polymethylmethacrylate, polystyrene polycarbonate, and/or blends thereof,
wherein the terminal is held in place by solidified plastic during the molding.

21. The method according to claim 14, further comprising, after the embedding of the wire, providing at least one protective coating at least partly covering the first carrier layer, the wire, the second carrier layer and/or the terminal.

22. The method according to claim 14, wherein the embedding is carried out using a stationary wire embedding system, wherein especially the first carrier layer, the second carrier layer and/or the terminal is or are moved relative to at least one wire embedding head of the wire embedding system.

\* \* \* \* \*